US012563943B2

(12) United States Patent
Hwang et al.

(10) Patent No.: US 12,563,943 B2
(45) Date of Patent: Feb. 24, 2026

(54) DISPLAY PANEL AND DISPLAY DEVICE INCLUDING THE SAME

(71) Applicant: LG DISPLAY CO., LTD., Seoul (KR)

(72) Inventors: Jong Hee Hwang, Paju-si (KR); Ki Duk Kim, Paju-si (KR); Yong Kyun Choi, Paju-si (KR); Jung Hoon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 541 days.

(21) Appl. No.: 17/984,361

(22) Filed: Nov. 10, 2022

(65) Prior Publication Data

US 2023/0172027 A1     Jun. 1, 2023

(30) Foreign Application Priority Data

Nov. 30, 2021     (KR) ......................... 10-2021-0169009

(51) Int. Cl.
 H10K 59/40 (2023.01)
 H10K 59/65 (2023.01)
(52) U.S. Cl.
 CPC ............. H10K 59/40 (2023.02); H10K 59/65 (2023.02)
(58) Field of Classification Search
 CPC ............................... H10K 59/40; H10K 59/65
 See application file for complete search history.

(56) References Cited

U.S. PATENT DOCUMENTS

2021/0359031 A1* 11/2021 Zheng ................... H10K 59/353
2022/0320474 A1* 10/2022 Shin ...................... H10K 59/131

FOREIGN PATENT DOCUMENTS

CN        110914891 A     3/2020
KR      20170067077 A     6/2017
KR      20210098091 A     8/2021

OTHER PUBLICATIONS

Office Action in Korean Appln. No. 10-2021-0169009, mailed on Nov. 27, 2025, 15 pages (with English translation).

* cited by examiner

*Primary Examiner* — Anne M Hines
(74) *Attorney, Agent, or Firm* — Fish & Richardson P.C.

(57) ABSTRACT

The present disclosure is related to a display panel for interfacing with a plurality of sensors that are attached to a bottom surface of the display panel. The display panel includes a light emitting layer configured to output images, and a protective layer configured to protect the display panel. The light emitting layer includes a display region having a first pixel density, a first transmissive region having a second pixel density that is less than the first pixel density, and a second transmissive region having a third pixel density that is less than the second pixel density. The first transmissive region is configured to interface with a first sensor and the second transmissive region is configured to interface with a second sensor, wherein a function of the first sensor requires less light than a function of the second sensor.

16 Claims, 19 Drawing Sheets

530     520

530a     520     530b

LED

TA1

TA2

TA1

TA2

Touch IC

DISPLAY PANEL AND DISPLAY DEVICE INCLUDING THE SAME

CROSS-REFERENCE TO RELATED APPLICATION

This application claims priority to and the benefit of Korean Patent Application No. 10-2021-0169009, filed on Nov. 30, 2021, the disclosure of which is incorporated herein by reference in its entirety.

BACKGROUND

Field of the Invention

The present disclosure relates to a display panel and a display device including the same.

Description of Related Art

An electroluminescence display device is broadly classified into an inorganic light emitting display device and an organic light emitting display device according to a material of a light emitting layer. An active-matrix type organic light emitting display device includes an organic light emitting diode (hereinafter, referred to as "OLED") which emits light by itself, and has an advantage of a quick response time, high luminous efficiency, high luminance, and a wide viewing angle. In the organic light emitting display device, the OLED (organic light emitting diode which is referred to as "OLED") is formed in each pixel. The organic light emitting display device has a quick response time, excellent luminous efficiency, luminance, and viewing angle, and the like, and since a black gray level can be expressed as perfect black, a contrast ratio and color gamut are excellent.

Multi-media functions of a mobile device have been improved. For example, a camera is integrated into a smartphone, and the resolution of the camera is increasing to a level of that of a conventional digital camera. However, a front camera of the smartphone limits a screen design, and the screen design can be difficult. To reduce space occupied by the camera, a screen design including a notch or a punch hole has been adopted in a smartphone, but since a screen size is still limited due to the camera, a full-screen display cannot be implemented.

To realize the full-screen display, a method of providing a sensing region where pixels having a lower pixels per inch (PPI) are disposed in a screen of a display panel, and disposing a camera at a position opposite the sensing region under the display panel is proposed. However, due to loss of transmittance by touch electrodes disposed on the display panel and a sudden PPI change, various problems such as spots may be recognized in a boundary portion between the pixel region and the sensing region having a different PPI, and image quality of the sensing region may be deteriorated.

SUMMARY OF THE INVENTION

The present disclosure is directed to solving all the above-described necessity and problems.

The present disclosure is directed to providing a display panel capable of minimizing the image quality degradation of a sensing region and a display device including the same.

It should be noted that objects of the present disclosure are not limited to the above-described objects, and other objects of the present disclosure will be apparent to those skilled in the art from the following descriptions.

In the present disclosure, since a pixel unit and a touch sensor unit are divided into a plurality of regions based on an arrangement position of a sensor disposed under a display panel, and resolutions of pixels and electrode densities of touch sensors are differently designed according to the plurality of regions, stains of a boundary portion and image quality deterioration of a sensing region can be minimized by applying a multi-resolution panel structure.

In the present disclosure, the optical characteristics for a sensor can be secured by lowering the electrode density of touch sensors in a region where the sensor is disposed.

In the present disclosure, a reduction of a sensing region and an improvement in display competitiveness can be expected by optimizing and arranging a plurality of sensors disposed on a back surface of a display panel as one integrated module.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features and advantages of the present disclosure will become more apparent to those of ordinary skill in the art by describing in detail exemplary aspect s thereof with reference to the accompanying drawings, in which.

DETAILED DESCRIPTION

Figure 1:
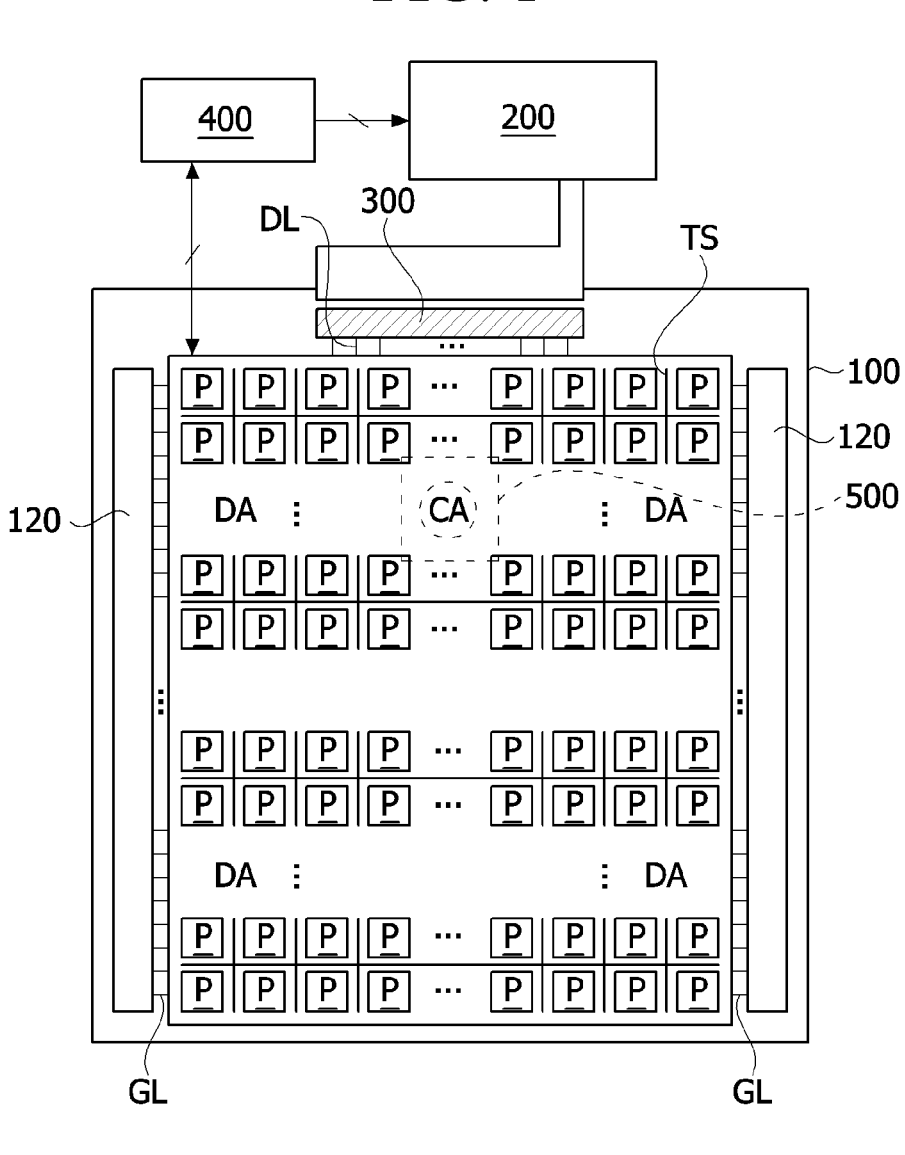
FIG. 1 is a view schematically illustrating a display device according to an aspect aspect of the present disclosure.

The advantages and features of the present disclosure and methods for accomplishing the same will be more clearly understood from aspects described below with reference to the accompanying drawings. However, the present disclosure is not limited to the following aspects but may be implemented in various forms. Rather, the present aspects will make the disclosure of the present disclosure complete and allow those skilled in the art to completely comprehend the scope of the present disclosure. The present disclosure is defined within the scope of the accompanying claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following aspects can be partially or entirely bonded to or combined with each other and can be linked and operated in technically various ways. The aspects can be carried out independently of or in association with each other.

Hereinafter, various aspects of the present disclosure will be described in detail with reference to the accompanying drawings.

A display device of the present disclosure may be implemented as a flat panel display device such as a liquid crystal display (LCD) device, an organic light emitting diode display (OLED display) device, or the like. In the aspects to be described below, an OLED display device will be mainly described as an example of a flat panel display device, but the present disclosure is not limited thereto. For example, an OLED display device may be integrated into wearable components, head mounted display (HMD) for extended reality functions, and so forth.

Touch sensors of the present disclosure may be disposed on a screen of a display panel in an on-cell type or an add-on type, or an in-cell type touch sensor may be built-in in the display panel. In the aspects to be described below, the in-cell type touch sensor will be mainly described, but the touch sensors of the present disclosure are not limited thereto.

Figure 2:
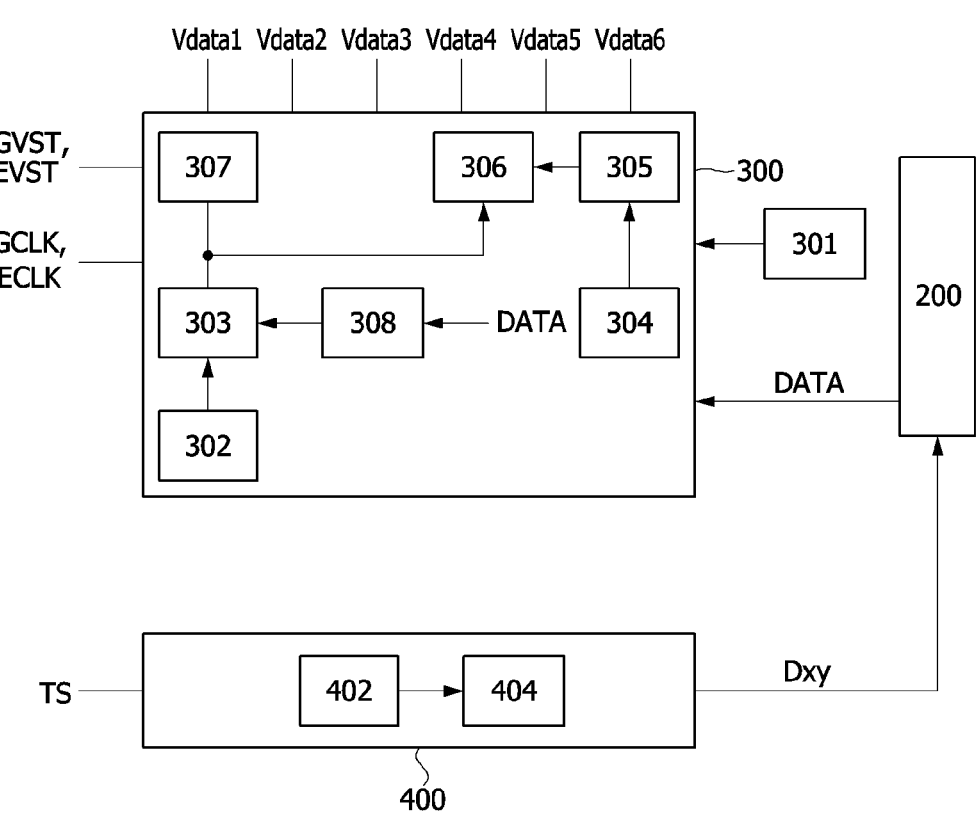
FIG. 2 is a view schematically illustrating a configuration of a drive integrated circuit (IC)

FIG. 1 is a view schematically illustrating a display device according to an aspect of the present disclosure, and FIG. 2 is a view schematically illustrating a configuration of a drive integrated circuit (IC) according to an aspect of the present disclosure.

Referring to FIGS. 1 and 2, the display device according to the aspect of the present disclosure may include a display panel 100 that includes a pixel array configured to output images, a display panel driver integrated into the display panel 100, a touch sensor driver 400, and the like.

The pixel array of the display panel 100 includes data lines DL, gate lines GL crossing the data lines DL, and display pixels P arranged in a matrix and defined by the data lines DL and the gate lines GL. The pixel array may further include power lines for supplying power to pixels. The pixel array includes display regions DA which display an input image in a display mode and sensing regions CA.

In one aspect, light may pass through sensing regions CA and may be incident on light reception surfaces of optical sensors 500 that are disposed under the display panel 100.

In the display regions DA and the sensing regions CA, each sub-pixel of the display pixel includes a pixel circuit. The pixel circuit includes a driving element configured to supply a current to a light emitting element (e.g., an OLED), a plurality of switch elements configured to sample a threshold voltage of the driving element and switch a current path of the pixel circuit, a capacitor configured to maintain a gate voltage of the driving element, and the like. Each sensor pixel S of the sensing regions CA includes an organic photodiode and a sensor driving circuit which drives the photodiode.

The display panel driver, which may be integrated into a drive IC 300, may be configured to write pixel data of the input image to the display pixels P. The display panel driver includes a data driver 306 which supplies a data voltage of the pixel data to the data lines DL, and a gate driver 120 is configured to supply a gate pulse sequentially to the gate lines GL. In one illustrative example, the data driver 306 may be integrated into a drive IC 300. The data driver 306 may be integrated into the drive IC 300 together with a timing controller 303.

The drive IC 300 may include a data reception and calculation unit 308, a timing controller 303, the data driver 306, a gamma compensation voltage generator 305, a power supply unit 304, a second memory 302, and the like. The drive IC 300 may be connected to a host system 200, a first memory 301, and the display panel 100.

In one illustrative aspect, the drive IC 300 may be attached to (e.g., bonded to) a portion of the display panel 100. The drive IC 300 receives the pixel data of the input image and a timing signal from the host system 200 to supply the data voltage of the pixel data to the display pixels through the data lines DL. The drive IC 300 may also synchronize the data driver 306 and the gate driver 120.

The drive IC 300 is connected to the data lines DL through data output channels to supply the data voltage of the pixel data to the data lines DL. The drive IC 300 may output a gate timing signal for controlling the gate driver 120 through gate timing signal output channels. The gate timing signal generated from the timing controller 303 may include a start pulse (e.g., a gate start pulse) VST, a shift clock (e.g., a gate shift clock) CLK, and the like. The start pulse VST and the shift clock CLK swing between a gate-on voltage VGL and a gate-off voltage VGH. The gate timing signals VST and CLK are output from a level shifter 307 and applied to the gate driver 120 to control a shift operation of the gate driver 120.

The gate driver 120 may include a shift register formed in a circuit layer of the display panel 100 together with the pixel array. The shift register of the gate driver 120 sequentially supplies a gate signal to the gate lines GL based on the timing controller 303. The gate signals may include a scan pulse applied to the pixel circuit, a pulse of an emission control signal (hereinafter, referred to as an "EM pulse"), and an exposure signal TG applied to the sensor driving circuit. The shift register may include a scan driver which outputs the scan pulse and an EM driver which outputs the EM pulse. In FIG. 2, GVST and GCLK are gate timing signals that are input to the scan driver. EVST and ECLK are gate timing signals that are input to the EM driver.

The data reception and calculation unit 308 includes a reception unit that receives the pixel data that is input (e.g., a digital signal) from the host system 200, and a data calculation unit that improves image quality by processing the pixel data. The data calculation unit may include a data restoration unit that decodes and restores compressed pixel data, an optical compensation unit which adds a preset optical compensation value to the pixel data, and the like. The optical compensation value may be derived for each pixel and may be stored in the memories 301 and 302, for example, in a look-up table form to compensate for a luminance deviation of pixels. The luminance deviation of pixels may measured based on an image captured and obtained by the camera during a manufacturing process.

An external compensation circuit may be applied to the display pixels and the drive IC 300. In this case, the data reception and calculation unit 308 may compensate for controlling deviation and deterioration of the pixels by adding or multiplying a sensing result of the display pixels to the pixel data of the input image.

The timing controller 303 provides the pixel data of the input image received from the host system 200 to the data driver 306. The timing controller 303 generates the gate timing signal for controlling the gate driver 120 and a source timing signal for controlling the data driver 306 to control operation timings of the gate driver 120 and the data driver 306.

The data driver 306 converts the pixel data (e.g., digital data) received from the timing controller 303 through a digital to analog converter (DAC) based on a gamma compensation voltage generator 305 and outputs the data voltage. The data voltage output from the data driver 306 is supplied to the data lines DL of the pixel array through an output buffer connected to a data channel of the drive IC 300.

In some aspects, the gamma compensation voltage generator 305 divides a gamma reference voltage from the power supply unit 304 through a voltage dividing circuit to generate the gamma compensation voltage for each gray level. The gamma compensation voltage is an analog voltage in which a voltage is set for each gray level of pixel data. The gamma compensation voltage output from the gamma compensation voltage generator 305 is provided to the data driver 306. The gamma compensation voltage generator 305 may be implemented as a programmable voltage generation circuit capable of varying a voltage level of an output voltage according to a register setting value.

The power supply unit 304 generates power required for driving the pixel array of the display panel 100, the gate driver 120, and the drive IC 300 using a DC-DC converter. The DC-DC converter may include a charge pump, a regulator, a buck converter, a boost converter, and the like. The power supply unit 304 may adjust a DC input voltage from the host system 200 to generate DC power such as the gamma reference voltage, the gate-on voltage VGL, the gate-off voltage VGH, a pixel driving voltage ELVDD, a low potential power voltage ELVSS, a reference voltage Vref, an initialization voltage Vini, and the like. The gamma reference voltage is supplied to the gamma compensation voltage generator 305. The gate-on voltage VGL and the gate-off voltage VGH are supplied to the level shifter 307 and the gate driver 120. Pixel power, such as the pixel driving voltage ELVDD, the low potential power voltage ELVSS, the initialization voltage Vini, and the like, is commonly supplied to the pixels P. The pixel driving voltage ELVDD is set to a voltage higher than the low potential power voltage ELVSS. The initialization voltage Vini and the reference voltage Vref may be set to voltages lower than the pixel driving voltage ELVDD and lower than or equal to the low potential power voltage ELVSS.

The second memory 302 stores a compensation value, register setting data, and the like received from the first memory 301 when power is input to the drive IC 300. The compensation value may be applied to various algorithms to improve image quality. For example, the compensation value may include an optical compensation value. The register setting data is previously set to control operations of the data driver 306, the timing controller 303, the gamma compensation voltage generator 305, and the like. The first memory 301 may include a non-volatile memory such as a flash memory. The second memory 302 may include a volatile memory such as a static random-access memory (SRAM).

The host system 200 may be implemented as an application processor (AP). The host system 200 may transmit the pixel data of the input image to the drive IC 300 through a mobile industry processor interface (MIPI). The host system 200 may be connected to the drive IC 300 through, for example, a flexible printed circuit (FPC).

A touch sensor TS may be implemented on the display panel as a capacitive type touch sensor, for example, a mutual capacitance sensor or a self-capacitance sensor. Self-capacitance is formed along a single-layer conductor line formed in one direction. Mutual capacitance is formed between two orthogonal conductor lines. The touch sensor TS may be implemented as a mesh type line to increase light transmittance.

In one example, the mutual capacitance sensor includes the mutual capacitance formed between two touch electrodes. A mutual capacitance sensing circuit applies a driving signal or a stimulation signal to any one of the two electrodes and senses a touch input based on a charge change amount of the mutual capacitance through another electrode. When a conductor approaches the mutual capacitance, because a charge amount of the mutual capacitance is reduced, a touch input or a gesture may be sensed.

In another example, the self-capacitance sensor includes a self-capacitance formed in each sensor electrode. A self-capacitance sensing circuit supplies electric charges to each sensor electrode and senses a touch input based on a change in the amount of the self-capacitance. When the conductor approaches the self-capacitance, because the capacitance due to the conductor is connected to the capacitance of the sensor in parallel, a capacitance value increases. Accordingly, in the case of self-capacitance, the capacitance value of the sensor increases when the touch input is sensed.

The touch sensor driver 400 applies the driving signal to the touch sensor TS and senses a change in capacitance of the touch sensor TS to output the touch data when the change in capacitance is greater than or equal to a preset threshold value. The touch data includes coordinate information of each touch input. The touch data is transmitted to the host system 200. The host system 200 executes a command or an application program corresponding to the touch input.

The touch sensor driver 400 includes a sensing unit 402 and a touch recognition unit 404. The sensing unit 402 includes a driver (not shown) that applies a sensor driving signal to the touch sensor TS, an amplifier (not shown) that amplifies the signal of the touch sensor TS, an integrator (not shown) that accumulates an output voltage of the amplifier, an analog-to-digital converter (ADC) (not shown) that converts a voltage output by the integrator into digital data, and the like. The digital data output from the ADC indicates the change in capacitance of the touch sensor TS before and after the touch input. The touch recognition unit 404 compares the touch data received from the sensing unit with a preset threshold value, detects the touch data having a value higher than a threshold value, and generates coordinates Dxy of each touch input. The touch recognition unit 404 transmits the touch data Dxy, which indicates a position of each touch input, to the host system 200. The touch sensor driver 400 may be implemented as a micro control unit (MCU), but is not limited thereto. For example, the touch sensor driver 400 may be integrated into the drive IC 300 of a mobile device or a wearable device.

The display panel 100 may be implemented as a flexible panel and used as a flexible display. The flexible display may be changed in screen size by rolling, folding, and bending the flexible panel, and may be easily manufactured in various designs. The flexible display may be implemented as a rollable display, a foldable display, a bendable display, a slidable display, or the like. In some aspects, the flexible panel may be referred as a plastic OLED panel. The plastic OLED panel may include a back plate, and a pixel array can be disposed on an organic thin film adhered to the back plate.

In one aspect, the back plate may be a polyethylene terephthalate (PET) substrate. The pixel array and the touch sensor array may be formed on an organic thin film substrate. The back plate may block moisture permeation toward the organic thin film the prevent the pixel array from exposed to moisture. The organic thin film substrate may be a polyimide (PI) substrate. A multi-layer buffer film formed of an insulating material (not shown) may be formed on the organic thin film substrate. A circuit layer and a light emitting element and sensor layer may be stacked on the organic thin film.

In one aspect, the circuit layer may include a pixel circuit connected to lines such as data lines, gate lines, and power lines, and the like, a gate driver 120 connected to the gate lines, a demultiplexer array (not shown), a circuit for an auto probe check, and the like. The lines and circuit elements of the circuit layer may include a plurality of insulating layers, with two or more metal layers separated from each other with the insulating layer therebetween to electrically isolate the metal layers, and an active layer including a semiconductor material. In one aspect, all transistors in the circuit layer may be implemented as oxide thin film transistors (TFTs) that are formed using an n-channel type oxide semiconductor.

The transistor is a three-electrode element and may include a gate, a source, and a drain. The source is an electrode which supplies carriers to the transistor. In the transistor, the carriers start flowing from the source. The drain is an electrode through which the carriers exit the transistor. In the transistor, the carriers flow from the source to the drain. In the case of an n-channel transistor, since the carriers are electrons, a source voltage has a voltage lower than a drain voltage so that the electrons may flow from the source to the drain. In the n-channel transistor, current flows in a direction from the drain to the source. In the case of a p-channel transistor (PMOS), since the carriers are holes, a source voltage is higher than a drain voltage so that the holes may flow from the source to the drain. In the p-channel transistor, since the holes flow from the source to the drain, current flows from the source to the drain. It should be noted that the source and drain of the transistor are not fixed. For example, the source and the drain may be changed according to a voltage to be applied. Accordingly, the present disclosure is not limited due to the source and drain of the transistor. In the description below, the source and drain of the transistor will be referred to as first and second electrodes.

The gate pulse swings between a gate-on voltage and a gate-off voltage. The gate-on voltage is set to a voltage higher than a threshold voltage of the transistor, and the gate-off voltage is set to a voltage lower than the threshold voltage of the transistor. The transistor is turned on in response to the gate-on voltage, and is turned off in response to the gate-off voltage. In the case of the n-channel transistor, the gate-on voltage may be a gate high voltage VGH and the gate-off voltage may be a gate low voltage VGL. In the case of the p-channel transistor, the gate-on voltage may be the gate low voltage VGL, and the gate-off voltage may be the gate high voltage VGH.

The driving element of the pixel circuit may be implemented as a transistor. In the driving element, although electrical characteristics of all pixels should be uniform, there may be differences between the pixels due to process variations and element characteristic variations, and the electrical characteristics may change according to the lapse of display driving time. In order to compensate for the electrical characteristic variations of the driving elements, the display device may include an internal compensation circuit and an external compensation circuit. The internal compensation circuit is added to the pixel circuit in each of the sub-pixels to sample a threshold voltage Vth and/or mobility $\mu$ of the driving element, which changes according to the electrical characteristic of the driving element, and compensate for a change in real time. The external compensation circuit transmits a threshold voltage and/or mobility of the driving element sensed through a sensing line connected to each of the sub-pixels to an external compensation unit. The compensation unit of the external compensation circuit compensates for a change in the electrical characteristic of the driving element by reflecting the sensing result and modulating the pixel data of the input image. The external compensation circuit senses the voltage of the pixel, which changes according to the electrical characteristic of the driving element, and compensates for the electrical characteristic variations of the driving elements between the pixels by modulating the data of the input image in an external circuit based on the sensed voltage.

Figure 3:
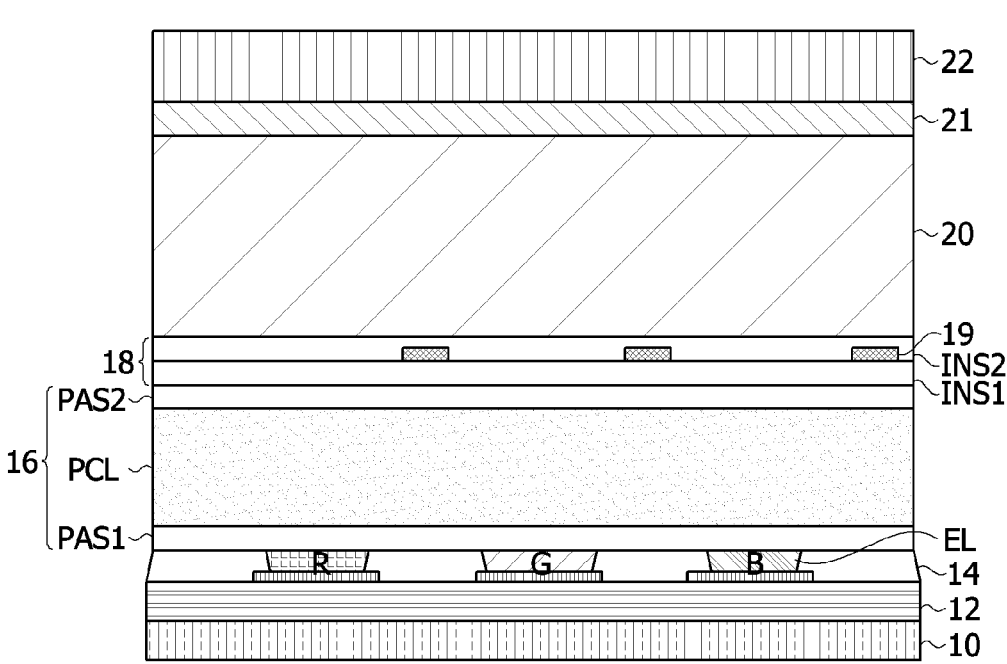
FIGS. 3 and 4 are cross-sectional views illustrating various cross-sectional structures of a display panel according to aspect various aspects of the present disclosure.
Figure 4:
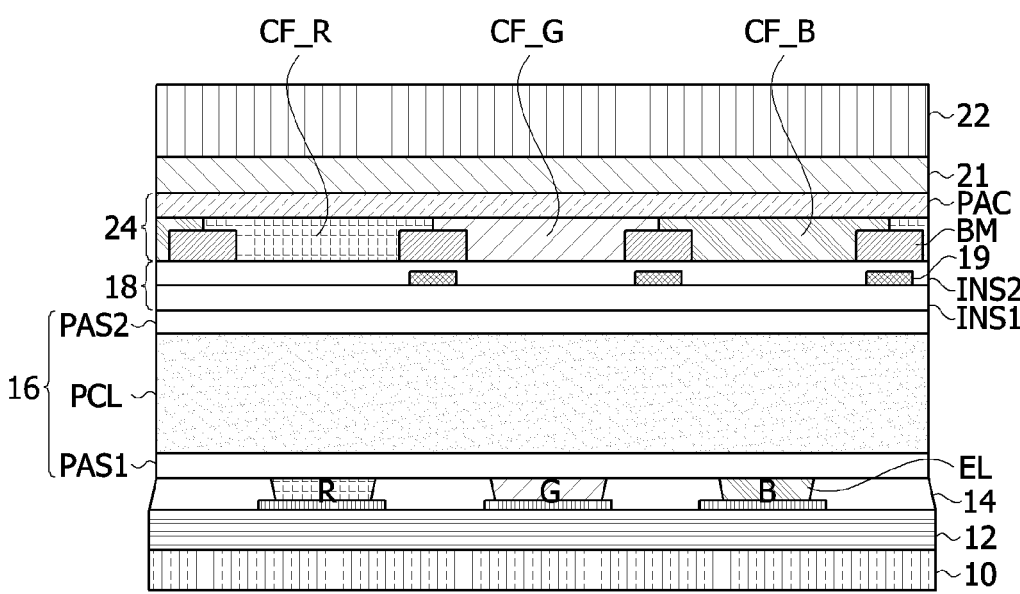

FIGS. 3 and 4 are cross-sectional views illustrating various cross-sectional structures of the display panel according to the aspect of the present disclosure.

Referring to FIG. 3, the display panel 100 may include a circuit layer 12, a light emitting element layer 14, an encapsulation layer 16, and a touch sensor layer 18 which are stacked on a substrate 10.

The circuit layer 12 may include a pixel circuit connected to lines such as data lines, gate lines, and power lines, and the like, a gate driver 120 connected to the gate lines, and the like. The lines and the circuit elements of the circuit layer 12 may include a plurality of insulating layers, two or more metal layers separated from each other with the insulating layer therebetween, and an active layer including a semiconductor material.

The light emitting element layer 14 may include light emitting elements EL driven by the pixel circuit. The light emitting elements EL may include a red light emitting element R, a green light emitting element G, and a blue light emitting element B. In another aspect, the light emitting element layer 14 may include a white light emitting element and a color filter. The light emitting elements EL of the light emitting element layer 14 may be covered by a protective layer (e.g., the encapsulation layer 16) including an organic layer and a protective film.

The encapsulation layer 16 covers the light emitting element layer 14 to seal the circuit layer 12 and the light emitting element layer 14. The encapsulation layer 16 may have a multi-insulating film structure in which organic films and inorganic films are alternately stacked. The inorganic film blocks permeation of moisture and oxygen. The organic film planarizes a surface of the inorganic film. When the organic films and the inorganic films are stacked in multiple layers, since a movement path of the moisture or oxygen becomes longer than that of a single layer, the permeation of the moisture and oxygen, which affect the light emitting element layer 14, may effectively be blocked.

In the encapsulation layer 16, an inorganic film PAS1, an organic film PCL, and an inorganic film PAS2 may be stacked. The touch sensor layer 18 may be disposed on the inorganic films PAS1 or PAS2 of the encapsulation layer 16.

The touch sensor layer 18 may include capacitive type touch sensors which sense a touch input based on a change in capacitance before and after the touch input. The touch sensor layer 18 includes metal line patterns 19 forming capacitances of the touch sensors TS and insulating films INS1 and INS2. The capacitances of the touch sensors TS may be formed between the metal line patterns 19. The insulating films INS1 and INS2 may insulate intersecting portions of the metal line patterns 19 and may planarize the surface of the touch sensor layer 18.

A polarization plate 20 may be disposed on the touch sensor layer 18. The polarization plate 20 may improve visibility and a contrast ratio by converting the polarization of external light reflected by metal of the touch sensor layer 18 and the circuit layer 12. The polarization plate 20 may be implemented as a polarization plate in which a linear polarization plate and a phase retardation film are bonded or a circular polarization plate. A cover glass 22 may be adhered to the polarization plate 20. The cover glass 22 may be adhered by an adhesive 21. The adhesive 21 is an adhesive for adhering the cover glass 22, and may be an optically transparent adhesive (OCA).

In the display panel 100 shown in FIG. 4, the polarization plate 20 is removed and a color filter layer 24 is added to replace the polarization plate 20.

Referring to FIG. 4, the display panel 100 may further include the touch sensor layer 18 formed on the encapsulation layer 16, and the color filter layer 24 formed on the touch sensor layer 18.

The color filter layer 24 may include a red color filter CF_R, a green color filter CF_G, and a blue color filter CF_B. Further, the color filter layer 24 may further include a black matrix pattern BM. The color filter layer 24 may absorb a portion of a wavelength of light reflected from the circuit layer 12 and the touch sensor layer 18 to serve as the polarization plate and increase color purity. In this aspect, the light transmittance of the display panel 100 may be improved and the thickness and flexibility of the display panel 100 may be improved by applying the color filter layer 24 having a higher light transmittance than the polarization plate to the display panel. The cover glass 22 may be adhered to the color filter layer 24 by the adhesive 21.

Figure 5A:
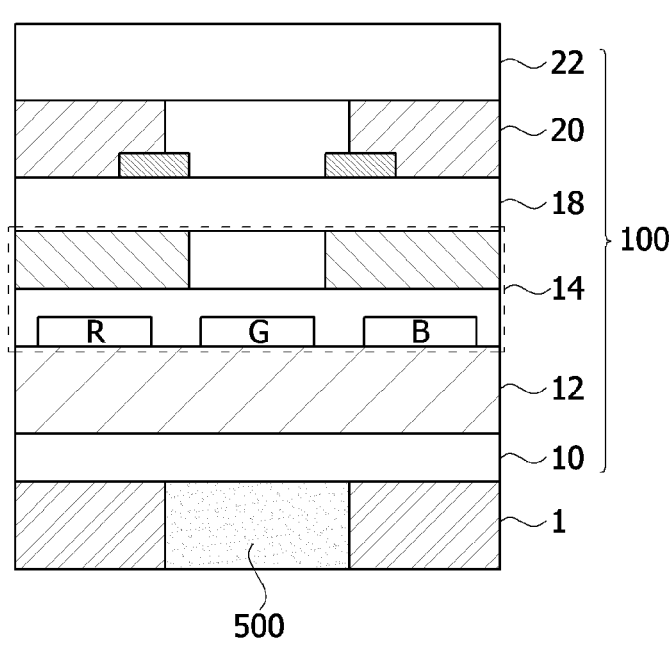
FIGS. 5A and 5B are views illustrating a schematic configuration of a display device according to aspect an aspect of the disclosure.
Figure 5B:
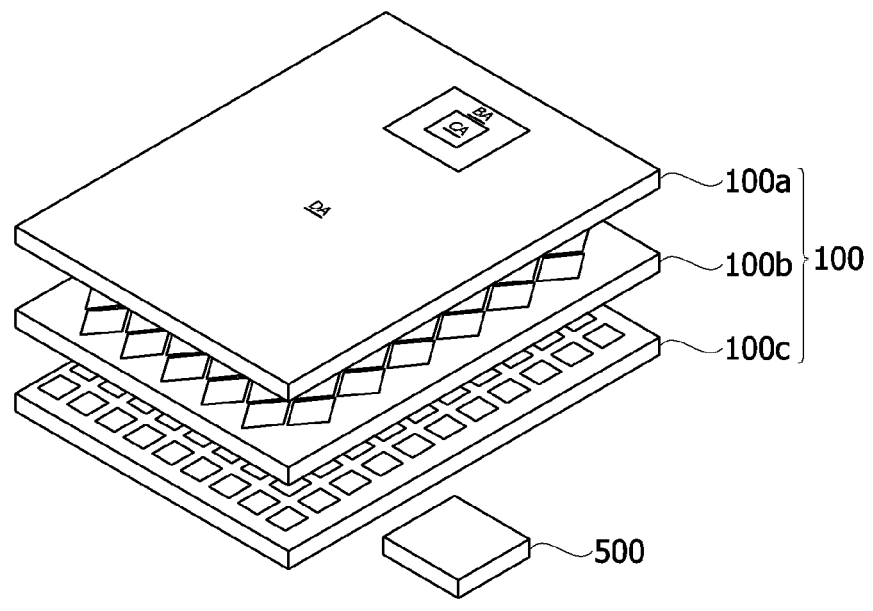

FIGS. 5A and 5B are views illustrating a schematic configuration of the display device according to the aspect of the disclosure.

Referring to FIGS. 5A and 5B, the display device according to the aspect may include a display panel 100 including a cover substrate 100a, a touch sensor unit 100b, and a pixel unit 100c, and an optical sensor 500.

The cover substrate 100a may be disposed at the top of the display panel 100, and may protect the display panel 100.

The pixel unit 100c may include a plurality of pixels arranged in a column direction and a row direction. Each of the plurality of pixels may include a circuit layer 12 and a light emitting element layer 14. The pixel unit 100c may be divided into a plurality of pixel regions DA, BA, and CA having different resolutions or pixels per inch (PPI) according to a position of the optical sensor 500.

The touch sensor unit 100b may sense a user's touch position. The touch sensor unit 100b may include a plurality of touch sensors. In the one aspect, the touch sensor unit 100b is divided into a plurality of touch sensor regions TA1 and TA2 according to a position of the sensor unit, and the touch sensors are disposed with different electrode densities according to the plurality of touch sensor regions TA1 and TA2.

The optical sensor 500 may include a plurality of optical sensors, may be disposed on a back surface of the display panel 100, and may be surrounded by a foam pad 1. That is, in the sensing region, the plurality of optical sensors may be disposed on the back surface of the display panel in a state in which the foam pad 1 is attached. Here, the plurality of optical sensors may be include, for example, a first optical sensor including a camera, an infrared (IR) camera, and the like, and a second optical sensor including a proximity sensor, an illuminance sensor (e.g., a photosensor), a bio-metric authentication sensor (face recognition sensor), and the like.

FIGS. 6A to 6D are views illustrating various structures of the sensor unit shown in FIGS. 5A and 5B.

Figure 6A:
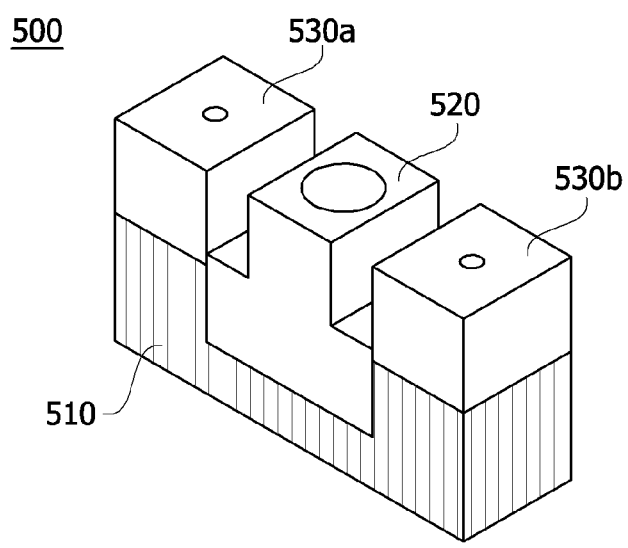
FIGS. 6A to 6D are views illustrating various structures of a sensor unit shown in FIGS. 5A and 5B according to an aspect of the disclosure.
Figure 6B:
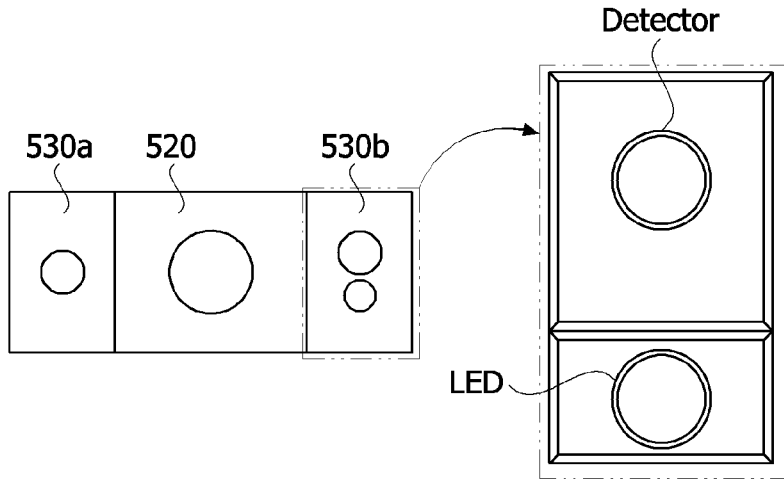

Referring to FIGS. 6A to 6D, the optical sensor 500 may formed as an integrated module as shown in FIG. 6A, the plurality of optical sensors may be horizontally disposed on a single frame 510. In the illustrated example of FIG. 6A, three optical sensors 520, 530a, and 530b may be disposed on the frame 510, with a first optical sensor 520 being disposed in a center region of the frame 510, and second optical sensors 530a and 530b being disposed on an edge region of the frame 510. For example, the first optical sensor 520 may be juxtaposed between the second optical sensors 530a and 530b.

In an additional description, the second optical sensor may include a proximity sensor and may include a light reception unit and a light emitting unit, and the light reception unit and the light emitting unit may be spaced apart from each other by at least a predetermined distance to minimize noise due to crosstalk. For example, a proximity detection dead zone increases when the light reception unit and the light emitting unit are spaced apart from each other by at least the predetermined distance or more. However, in this example, the light reception unit and the light emitting unit are disposed at the bottom rather than disposed on a back surface of conventional glass when disposed on a back surface of the display, and the influence of the dead zone is also reduced.

There is a limit to minimizing the proximity sensor due to a separation distance between the light reception unit and the light emitting unit. Accordingly, a structure of disposing a camera lens in the separation distance may be derived to efficiently dispose the module.

For example, the second optical sensor 530a may be an illuminance sensor, the second optical sensor 530b may be a proximity sensor including a light emitter (e.g., an LED) and a light detector (e.g., a photodetector). As shown in FIG.

Figures 6C, 6D:
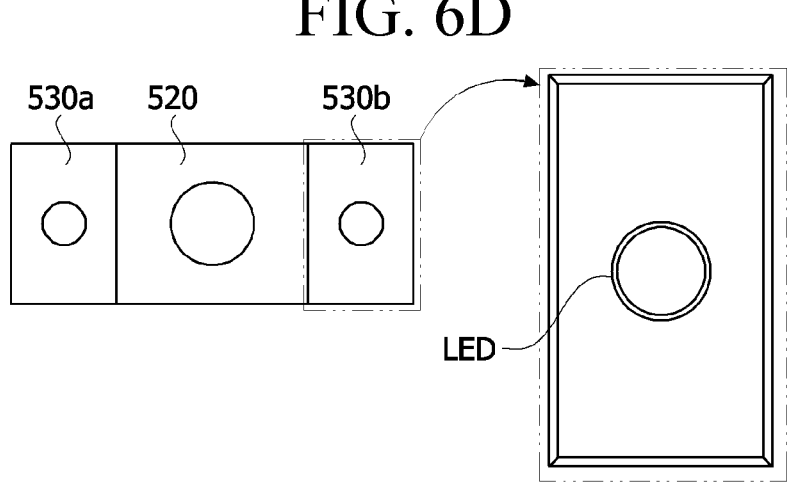

6B, the second optical sensor 530a and the second optical sensor 530b may be disposed different sides based on the first optical sensor 520, which is a camera. Referring to FIG. 6C, the second optical sensor 530 (e.g., a proximity sensor) may be disposed at one side based on the first optical sensor 520 (e.g., a camera). In another example, FIG. 6C illustrates an example in which the second optical sensors 530a and 530b (e.g., a proximity sensor and an illuminance sensor) may be disposed at both sides based on the first optical sensor 520. The arrangement of these optical sensors 520, 530a, and 530b is not limited to a specific arrangement form of the optical sensors.

In some aspects, the thickness or shape of the frame 510 may be formed according to positions where the sensors are respectively disposed to position the optical sensors 520, 530a, and 530b disposed on the frame 510 at the same height. For example, the frame 510 may be configured to have different thicknesses at the positions where the illuminance sensor and the proximity sensor are disposed to ensure that a top surface the plurality of optical sensors is planar.

The plurality of optical sensors are formed as one integrated module because the process is not individually performed and thus convenience of the process increases, and it is advantageous for planarizing the device when attached.

Figure 7A:
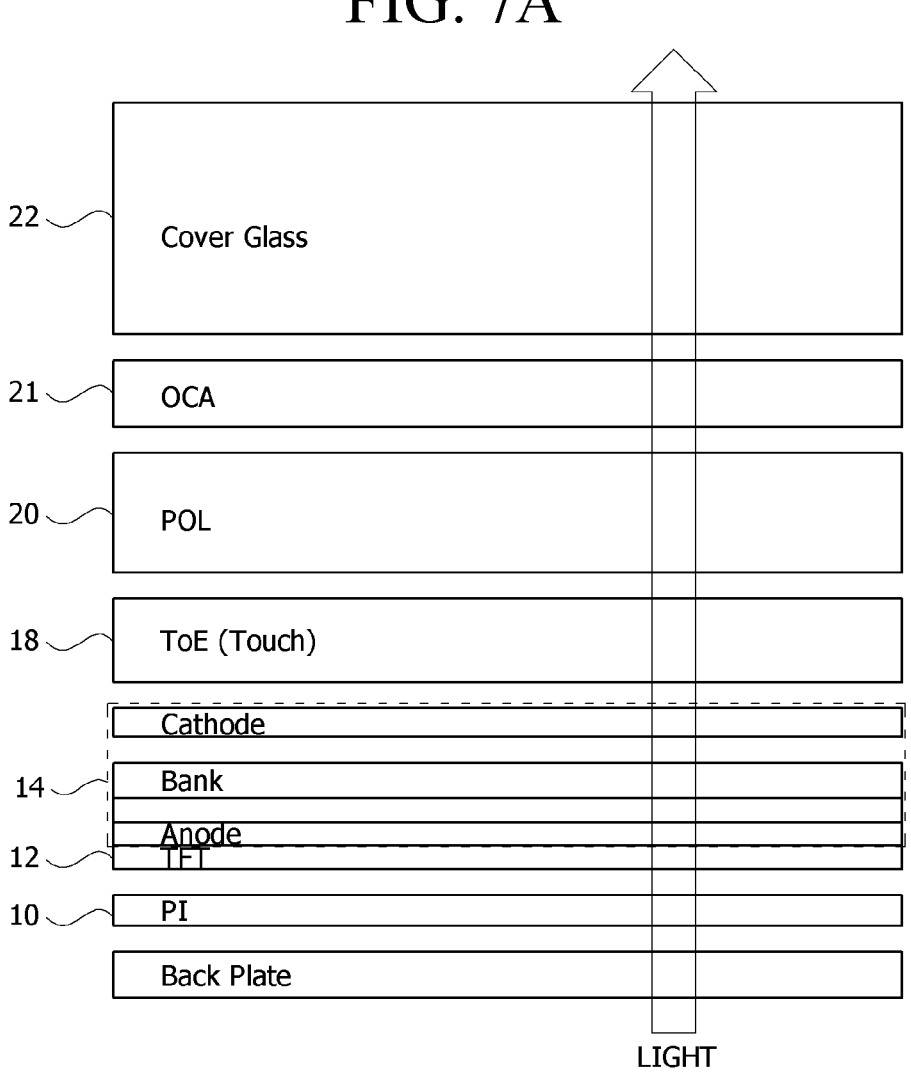
FIGS. 7A and 7B are views illustrating a simulation result of transmittance in the display panel according to an aspect of the disclosure.
Figure 7B:
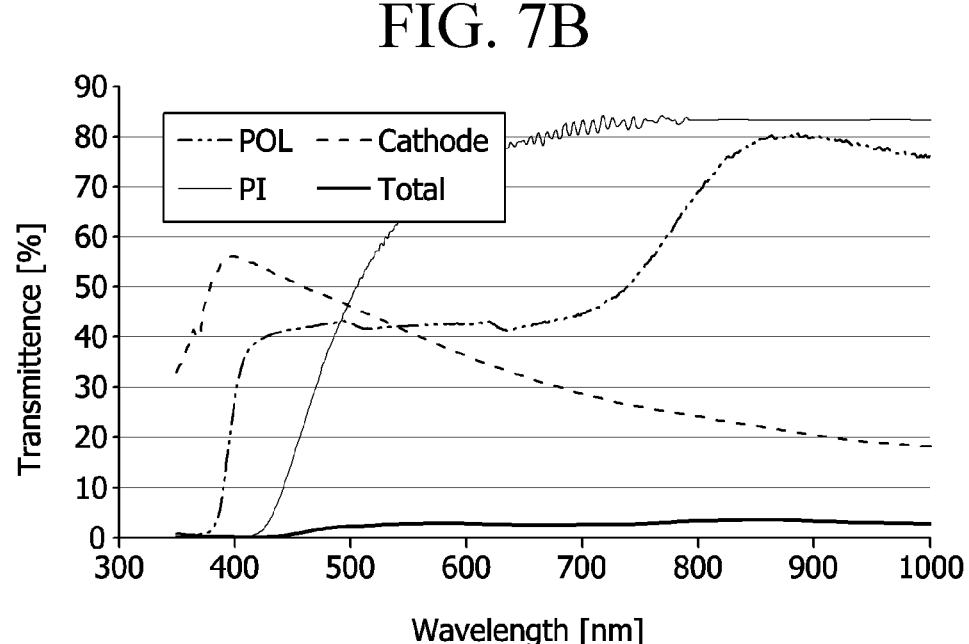

FIGS. 7A and 7B are views illustrating a simulation result of transmittance in the display panel.

Referring to FIGS. 7A and 7B, when a sensor is coupled to the sensing region of the display panel, the optical sensor such as the proximity sensor, the illuminance sensor, the biometric authentication sensor, a camera, and corresponding region of the display panel should have sufficient transmittance for visible light. Specifically, the camera receives light to generate an image with sufficient image quality compared to the proximity sensor, the illuminance sensor, the biometric authentication sensor, and the like, and should have a relatively high transmittance. In one aspect, the camera may be disposed in a region having the lowest PPI to improve light transmittance.

On the other hand, the proximity sensor, the illuminance sensor, and the biometric authentication sensor require transmittance conditions as shown in [Table 1] and further described below.

TABLE 1

| Sensor | Transmittance condition | Wavelength (nm) |
|---|---|---|
| Illuminance sensor | transmittance of 10% or more | visible light wavelength, 525~560 nm |
| Proximity sensor | transmittance of 10% or more | IR wavelength, 850~950 nm |
| Biometric authentication sensor | transmittance of 30% or more | IR wavelength, 850~950 nm |

As shown in Table 1, the proximity sensor, the illuminance sensor, and the biometric authentication sensor may each secure sufficient transmittance even when disposed in a region having a relatively high PPI as compared to the camera. In this case, even when the transmittance conditions are different as in Table 1, since an element that affects IR transmittance most is a cathode layer, the same cathode patterning should be performed in the region where the sensor such as the camera, the proximity sensor, the illuminance sensor, the biometric authentication sensor, or the like is disposed.

In the aspect, the display regions and the sensing regions are divided, and the sensing regions are divided into a first sensing region CA and a second sensing region BA to differently design a resolution for each region.

Figure 8A:
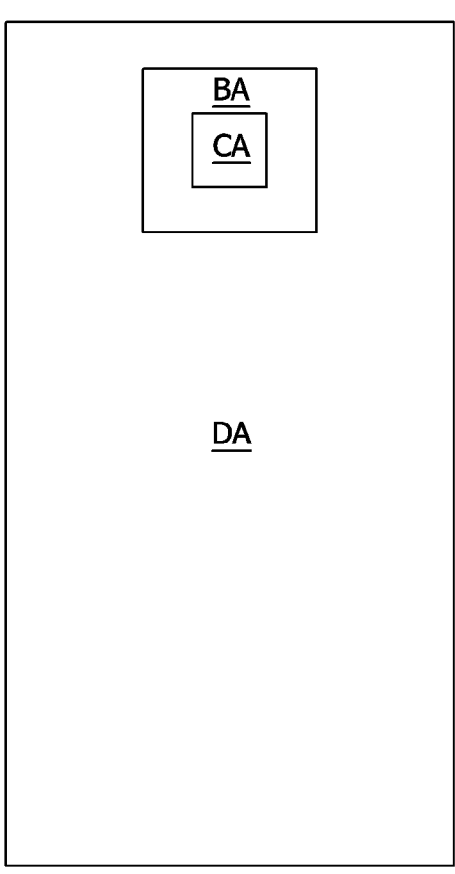
FIGS. 8A to 8I are views illustrating a screen including a display region and a sensing region according to aspect an aspect of the disclosure.
Figure 8A:
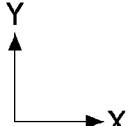
Figure 8B:
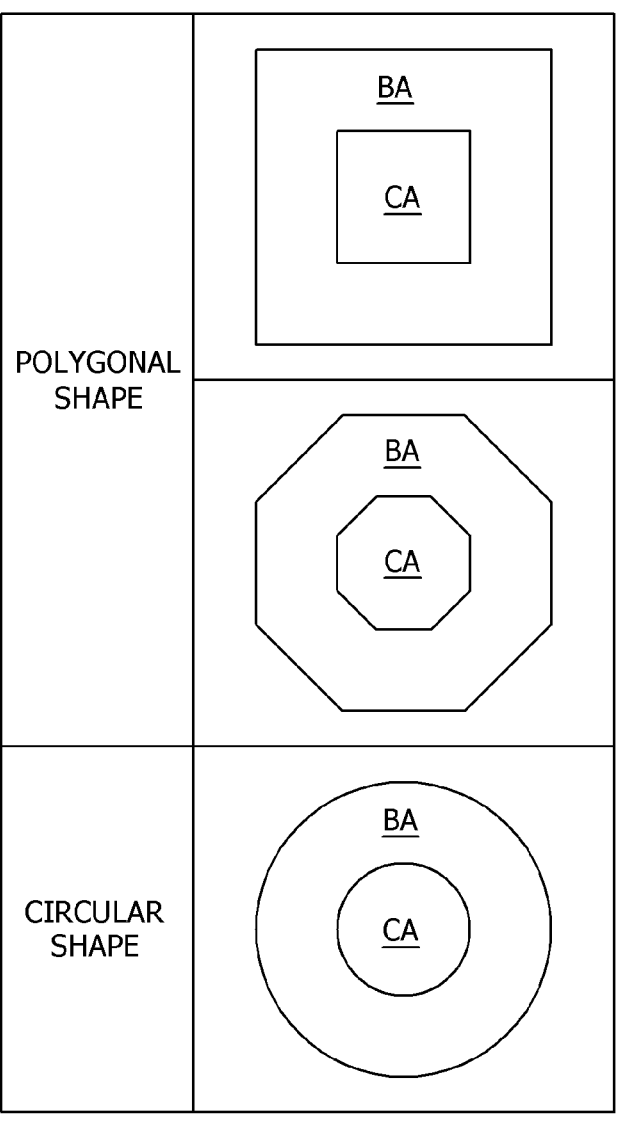
Figure 8C:
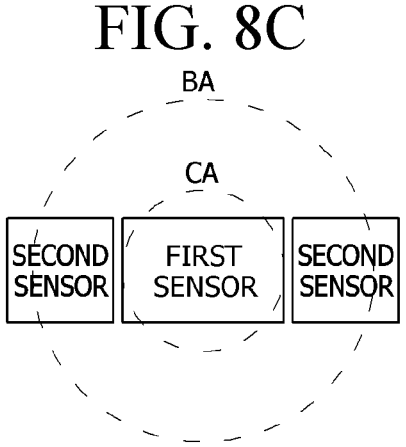
Figure 8D:
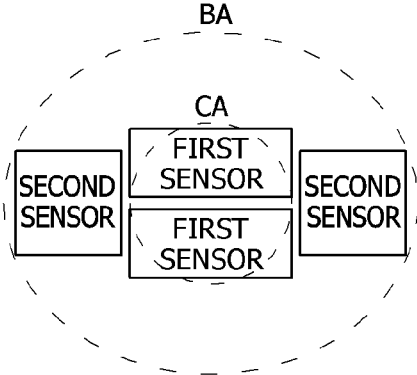
Figure 8E:
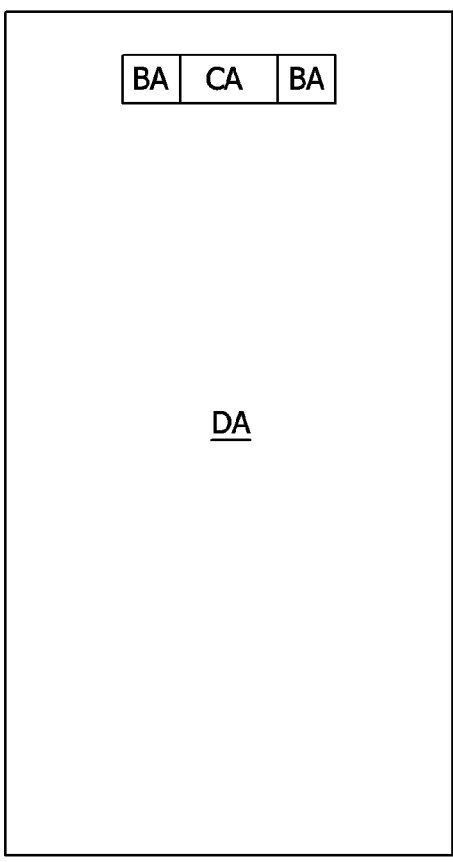
Figure 8E:
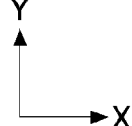
Figure 8F:
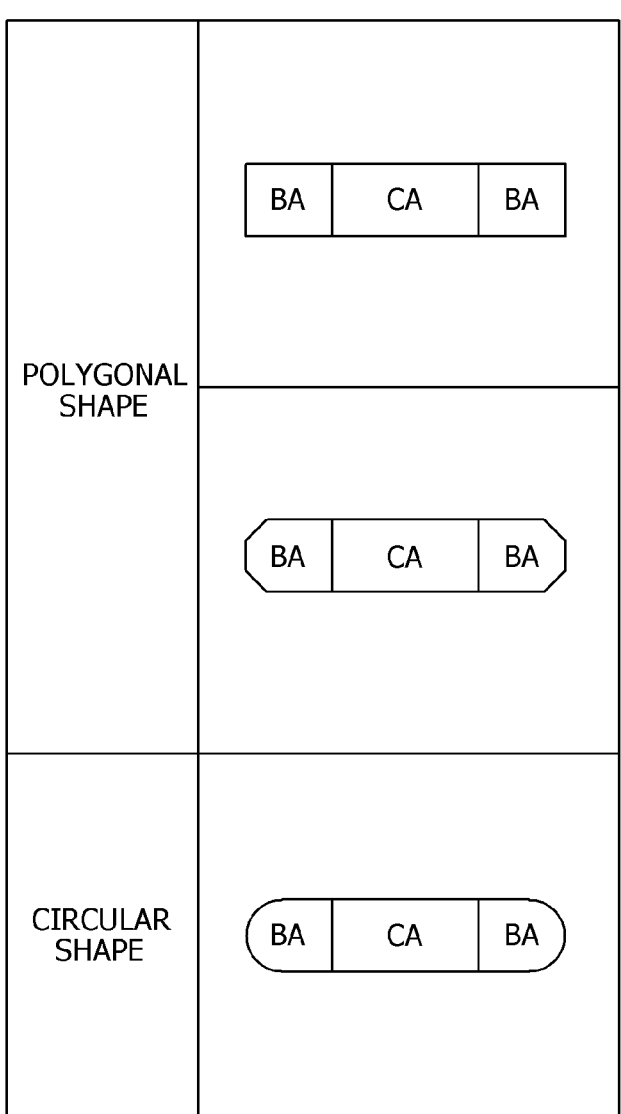
Figure 8G:
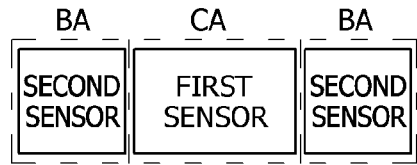
Figure 8H:
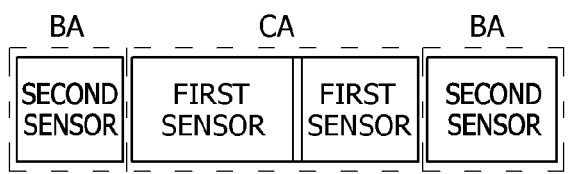
Figure 8I:
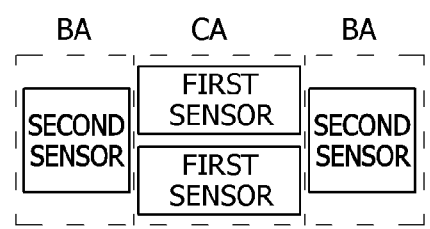
Figure 9:
FIG. 9 is a view illustrating pixel arrangement in a pixel region according to aspect an aspect of the disclosure.

FIGS. 8A to 8I are views illustrating a screen including the display region and the sensing region according to the aspect, and FIG. 9 is a view illustrating pixel arrangement in the pixel region according to the aspect.

Referring to FIG. 8A, the pixel unit of the display panel 100 according to the aspect may include the plurality of pixel regions, and the plurality of pixel regions may be divided into a first pixel region, a second pixel region, and a third pixel region. For example, the first pixel region and the second pixel region may be regions where the pixels corresponding to the first sensing region CA and the second sensing region BA are disposed, and the third pixel region may be a region where the pixels corresponding to the display region DA are disposed. In this case, the pixels may be disposed with different PPIs in the first pixel region, the second pixel region, and the third pixel region.

The first pixel region CA and the second pixel region BA may be regions where the sensors are disposed. The first pixel region CA may be a region corresponding to the first optical sensor that requires high transmittance, for example, the camera, is disposed, and the second pixel region BA may be a region where the second optical sensor which requires relatively low transmittance, for example, the proximity sensor, the illuminance sensor, or the biometric authentication sensor is disposed.

Referring to FIG. 8B, the first pixel region CA and the second pixel region BA according to an aspect may be formed in various shapes, for example, polygonal shapes or circular shapes.

The second pixel region BA may be a region between the third pixel region DA and the first pixel region CA.

A sudden change in PPI may distort and strain output images, such as bright lines and dark lines may be generated in a boundary portion between the third pixel region of a high-resolution and the first pixel region of a low-resolution, and since the first pixel region is widely formed, an image quality deterioration phenomenon significantly occurs compared to the third pixel region. In order to address this disadvantage, in the aspect, the second pixel region BA, which is an intermediate resolution region, is located between the third pixel region DA and the first pixel region CA, and for a transmittance loss portion due to addition of the intermediate resolution region, it makes it possible to minimize image quality deterioration due to a reduction of a low PPI area while securing the performance of the optical sensor through optimization of optical sensor arrangement.

Referring to FIGS. 8C and 8D, the optical sensor unit according to the aspect may be disposed in the sensing region, the first optical sensor which needs to secure relatively high transmittance may be disposed in the first sensing region CA, and two second optical sensors which need to secure relatively low transmittance may be disposed in the second sensing region BA.

As another example, two first optical sensors which need to secure relatively high transmittance may be disposed in the first pixel region CA, and two second optical sensors which need to secure relatively low transmittance may be disposed in the second pixel region BA.

Referring to FIG. 8E, the pixel unit of the display panel 100 according to the aspect may be divided into the plurality of pixel regions, and the first pixel region CA and the second pixel region BA may be formed at both sides of the third pixel region DA. In this structure, the first and second pixel regions may each be formed to have a size of the optical sensor.

Referring to FIG. 8F, the first pixel region CA and the second pixel region BA according to the aspect may each be formed in a bar shape, but are not necessarily limited thereto, and may be formed in various shapes.

Referring to FIGS. 8G to 8I, the optical sensors of the sensor unit according to the aspect may be disposed in the first and second pixel regions, and one first optical sensor which needs to secure relatively high transmittance may be disposed in the first pixel region CA, and two second optical sensors which need to secure relatively low transmittance may be disposed in the second pixel region BA.

As another example, two first optical sensors which need to secure relatively high transmittance may be disposed in the first pixel region CA, and two second optical sensors which need to secure relatively low transmittance may be disposed in the second pixel region BA.

A plurality of pixels with a first resolution may be disposed in the third pixel region DA, a plurality of pixels with a second resolution lower than the first resolution may be disposed in the second pixel region BA, and a plurality of pixels with a third resolution lower than the second resolution may be disposed in the first pixel region CA.

When it is assumed that the first resolution is $\alpha$, the second resolution is $\gamma$, and the third resolution is $\beta$, a relationship by the following Equation 1 is established.

$$\alpha > \gamma = (\alpha + \beta)/2 > \beta, \beta \alpha/2 \qquad \text{[Equation 1]}$$

For example, when the first pixel region is implemented at 440 PPI, the second pixel region which requires high transmittance may be implemented at 220 PPI, and the third pixel region which requires relatively low transmittance may be implemented at 330 PPI ((440+220)/2).

That is, in this aspect, each of the first pixel region CA and the second pixel region BA has a structure in which transmittance may be adjusted by having the same pixel size and varying the numbers of pixels to be disposed to differentiate an OLED element and a TFT region. In the aspect, the pixel densities are designed in the order of the third pixel region DA>the second pixel region BA>the first pixel region CA and are designed as a structure having multiple resolutions.

Accordingly, it is possible to secure performance with a smaller sensing region compared to a conventional structure.

Referring to FIG. 9, the pixel unit according to the aspect may be divided into the first pixel region CA, the second pixel region BA, and the third pixel region DA, and the first pixel region CA, the second pixel region BA, and the third pixel region DA may be regions where the pixels are disposed with different PPIs. Here, an example in which the number of pixels in the first pixel region, the number of pixels in the second pixel region, and the number of pixels in the third pixel region are formed differently is described, but the present disclosure is not limited thereto, and the PPI may be varied by forming the same number of pixels and varying the number of pixels to be driven.

The pixels located in the first pixel region CA are spaced apart from each other with light transmission parts AG therebetween. External light is incident on a light reception surface of the optical sensor disposed under the display panel through the light transmission parts AG. The light transmission parts AG may be formed of transparent media to reduce loss of light incident on the optical sensors disposed under the display panel. The light transmission parts AG may be formed of transparent insulating materials without including metal lines or pixels.

Figure 10A:
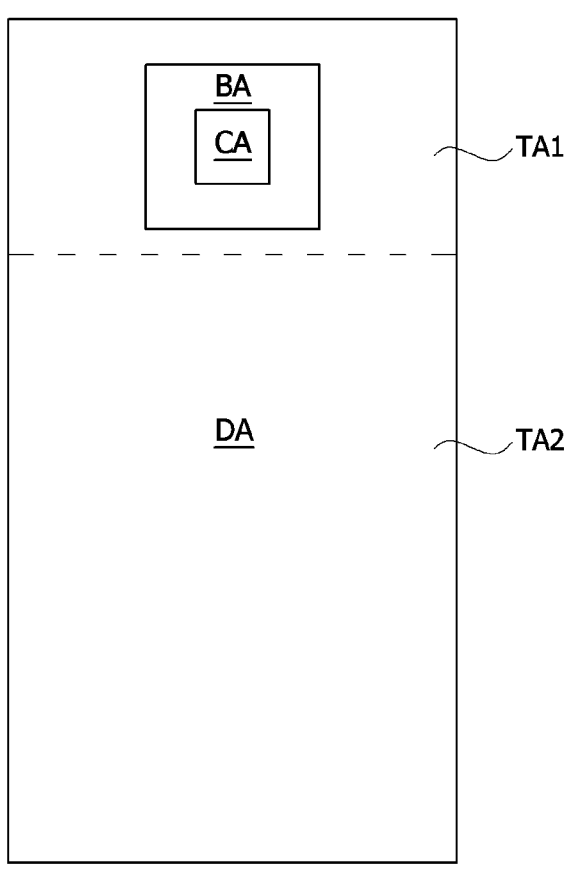
FIGS. 10A to 10D are views illustrating a touch sensor electrode density in a touch sensor region according aspect an aspect of the disclosure.
Figure 10A:
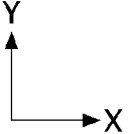
Figure 10B:
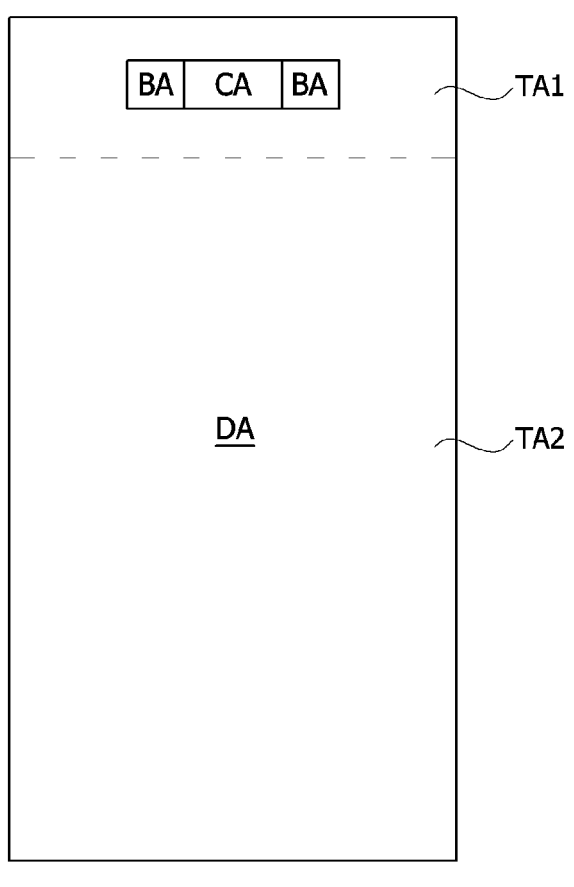
Figure 10B:
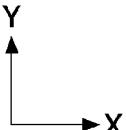
Figure 10C:
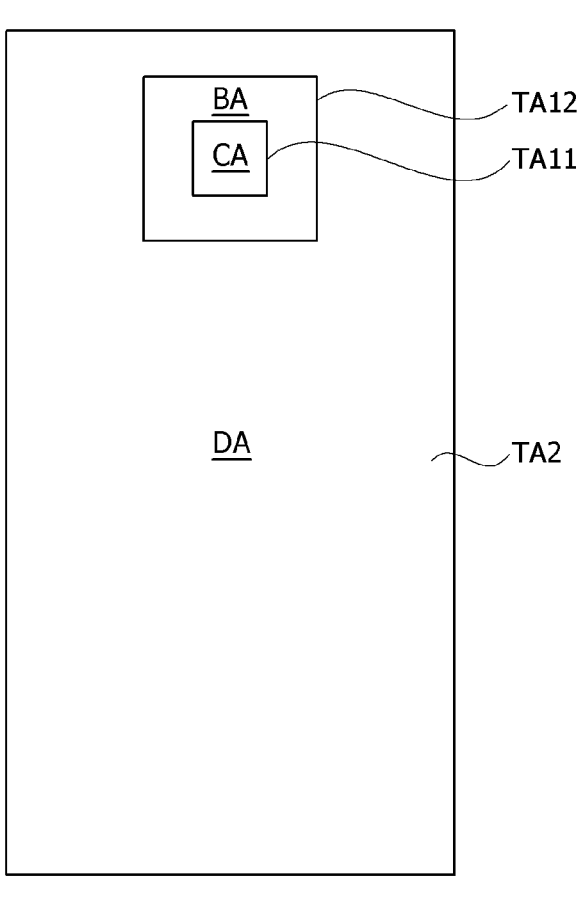
Figure 10D:
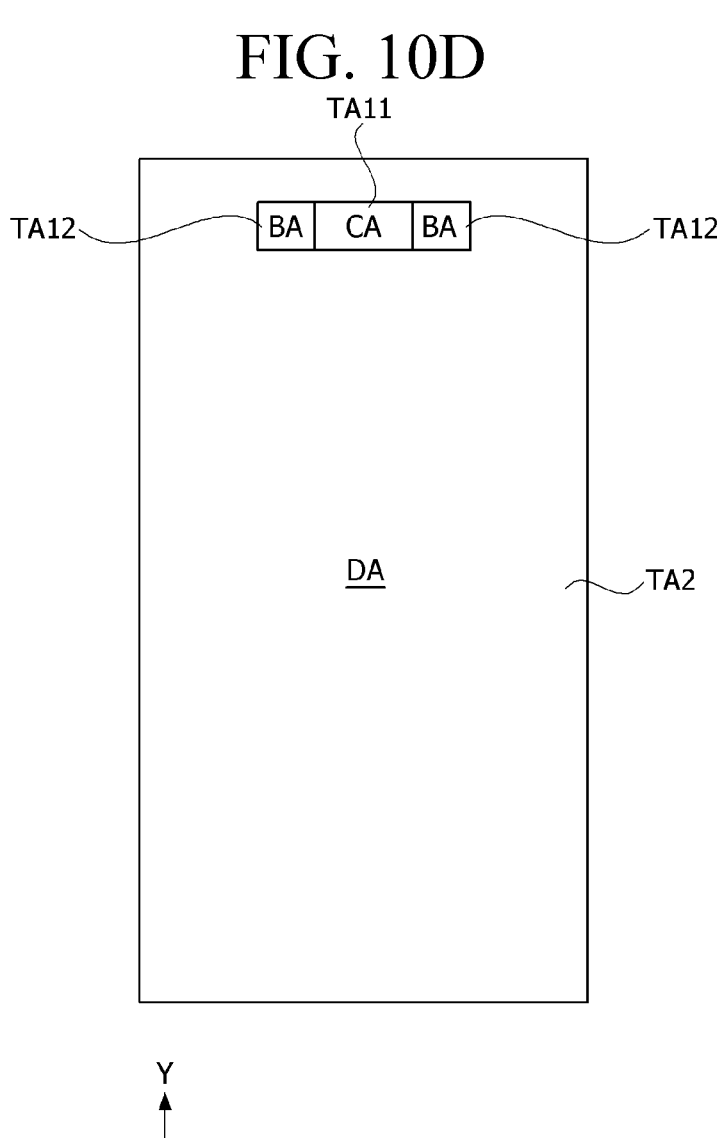
Figure 11:
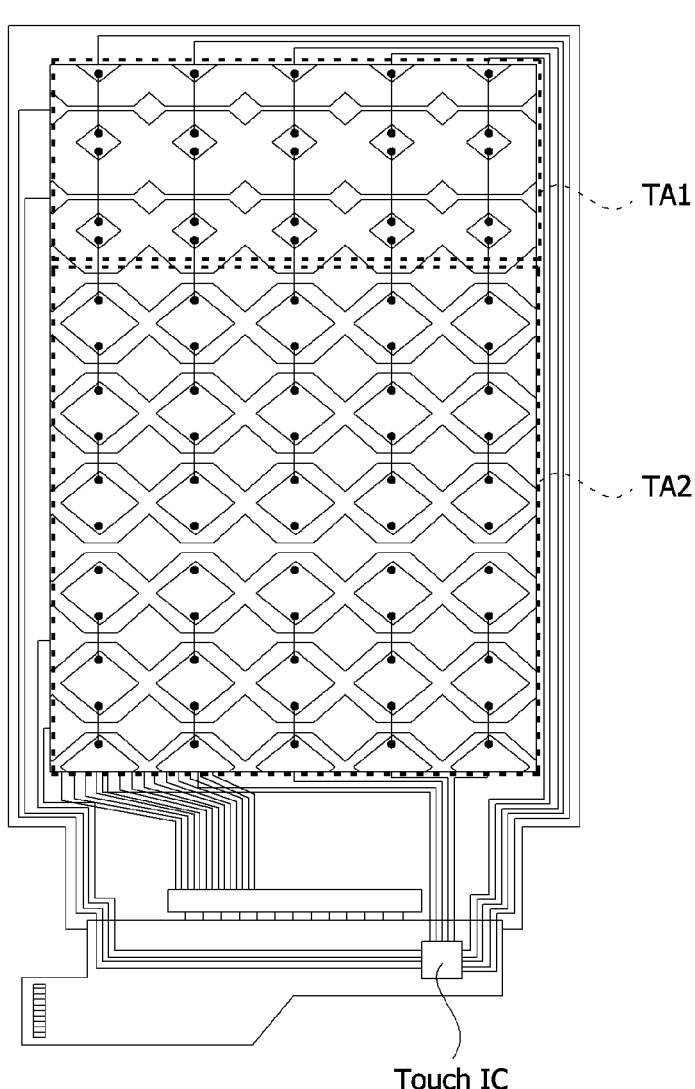
FIG. 11 is a view illustrating an example in which an electrode density of a touch sensor is differently realized according an aspect of the disclosure.

FIGS. 10A to 10D are views illustrating a touch sensor electrode density in a touch sensor region according to the aspect, and FIG. 11 is a view illustrating an example in which an electrode density of a touch sensor is realized differently.

Referring to FIGS. 10A and 10B, the touch sensor unit of the display panel 100 according to the aspect may be divided into a plurality of touch sensor regions, and may be divided into a first touch sensor region TA1 and a second touch sensor region TA2. The first touch sensor region TA1 may be a region where an optical sensor is disposed, and the second touch sensor region TA2 may be a region where a sensor is not disposed.

The first touch sensor region TA1 may minimize a region covered by metal, that is, may minimize the sizes and densities of a touch Tx electrode and a touch Rx electrode by varying the electrode density of the touch sensor.

The first touch sensor region TA1 may be designed to have the same touch sensor pattern from a left panel end to a right panel end of the sensing region. A high electrode density of the touch sensor is formed in the second touch sensor region TA2.

The second touch sensor region TA2 may be formed in a form of maintaining the electrode density of the touch sensor, that is, a form in which an entire touch region maintains the same electrode size and density to maintain touch performance. In the case of a mutual-type touch method, when a voltage is applied to the driving electrode, a charge transmitted by a mutual capacitance in a direction toward the sensing electrode is amplified to detect a charge change amount according to the presence of a touch.

Referring to FIGS. 10C and 10D, a touch sensor unit of a display panel 100 according to another aspect may be divided into a plurality of touch sensor regions, and may be divided into a touch sensor region TA11, a first-2 touch sensor region TA12, and a second touch sensor region TA2. The first touch sensor region TA11 may be a region where a first optical sensor is disposed, the first touch sensor region TA12 may be a region where a second optical sensor is disposed, and the second touch sensor region TA2 may be a region where a sensor is not disposed.

That is, the first touch sensor region TA11 corresponds to the first pixel region CA, the first touch sensor region TA12 corresponds to the second pixel region BA, and the second touch sensor region TA2 corresponds to the third pixel region DA.

The first touch sensor region TA11, the first touch sensor region TA12, and the second touch sensor region TA2 may be designed to have different electrode densities of the touch sensors. For example, in the aspect, the pixel densities are designed in the order of the second touch sensor region TA2>the first touch sensor region TA12>the first touch sensor region TA11 and are each designed in a structure having different electrode densities.

Referring to FIG. 11, the touch sensor unit is divided into the first touch sensor region TA1 and the second touch sensor region TA2, and the electrode density of the touch sensor disposed in each of the first touch sensor region TA1 and the second touch sensor region TA2 is differently realized.

Here, the electrode density refers to a density according to an electrode size of the touch sensor. The electrode density of the first touch sensor region TA1 is lower than that of the second touch sensor region TA2. Accordingly, the electrode size of the touch sensor disposed in the first touch sensor region TA1 is smaller than that of the touch sensor disposed in the second touch sensor region TA2.

That is, the transmittance required by the optical sensors may be inversely proportional to the electrode density of the touch sensors.

Although the aspects of the present disclosure have been described in more detail with reference to the accompanying drawings, the present disclosure is not limited thereto and may be embodied in many different forms without departing from the technical concept of the present disclosure. Therefore, the aspects disclosed in the present disclosure are provided for illustrative purposes only and are not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

Illustrative aspects of the disclosure include:

Aspect 1. A display panel, comprising: a light emitting layer configured to output images; a protective layer configured to protect the display panel; wherein the light emitting layer comprises a display region having a first pixel density, a first transmissive region having a second pixel density that is less than the first pixel density, and a second transmissive region having a third pixel density that is less than the second pixel density.

Aspect 2. The display panel of Aspect 1, wherein the first transmissive region is configured to interface with a first sensor and the second transmissive region is configured to interface with a second sensor, wherein a function of the first sensor requires less light than a function of the second sensor.

Aspect 3. The display panel of any of Aspects 1 to 2, wherein the first sensor comprises ones at least one of an illumination sensor, a fingerprint sensor, and a proximity detection sensor, and the second sensor comprises an image sensor.

Aspect 4. The display panel of any of Aspects 1 to 3, wherein the second transmissive region is configured to be disposed within the first transmissive region.

Aspect 5. The display panel of any of Aspects 1 to 4, wherein the second transmissive region is configured to be laterally juxtaposed between the first transmissive region.

Aspect 6. The display panel of any of Aspects 1 to 5, wherein the second transmissive region associated with the light emitting layer includes a plurality of light transmissive regions, and wherein a cathode is absent from regions corresponding to the plurality of light transmissive regions.

Aspect 7. The display panel of any of Aspects 1 to 6, further comprising: a touch layer configured to detect touch input, the touch layer being configured to have a first region having a first electrode pattern and a second region having a second electrode pattern that is different from the first electrode pattern.

Aspect 8. The display panel of any of Aspects 1 to 7, wherein the second region overlaps the first transmissive region and the second transmissive region.

Aspect 9. The display panel of any of Aspects 1 to 8, wherein the second region overlaps the first transmissive region, the second transmissive region, and the display region.

Aspect 10. A display panel, comprising: a light emitting layer configured to output images; and a touch layer configured to detect touch input on the light emitting layer; wherein the touch layer includes a first region having a plurality of first electrodes and a second region having a plurality of second electrodes, wherein a size of the first electrode is larger than a size of the second electrode.

Aspect 11. The display panel of Aspect 10, wherein the second region is disposed to cover a portion of the light emitting layer that has an increased transmissivity.

Aspect 12. The display panel of any of Aspects 10 to 11, wherein the first region of the touch layer is disposed at a first end of the display panel, and the second region of the touch layer is disposed at a second end of the display panel that opposes the first end.

Aspect 13. The display panel of any of Aspects 10 to 12, wherein the second region of the touch layer is disposed within and at least partially surrounded by the first region of the touch layer.

Aspect 14. The display panel of any of Aspects 10 to 13, wherein the portion of the light emitting layer comprises a first transmissive region having a first pixel density that is less than a median pixel density of the light emitting layer.

Aspect 15. The display panel of any of Aspects 10 to 14, wherein at least one sensor is configured to be disposed below the first transmissive region.

Aspect 16. The display panel of any of Aspects 10 to 15, wherein the portion of the light emitting layer comprises a second transmissive region having a second pixel density that is less than the first pixel density.

Aspect 17. The display panel of any of Aspects 10 to 16, wherein at least one first sensor is disposed below the first transmissive region and at least one second sensor is disposed below the second transmissive region.

What is claimed is:

1. A display panel, comprising:
a light emitting layer configured to output images;
a protective layer configured to protect the display panel;
wherein the light emitting layer comprises a display region having a first pixel density, a first transmissive region having a second pixel density that is less than the first pixel density, and a second transmissive region having a third pixel density that is less than the second pixel density,
wherein the first transmissive region is configured to interface with a first sensor and the second transmissive region is configured to interface with a second sensor, wherein a function of the first sensor requires less light than a function of the second sensor.

2. The display panel of claim 1, wherein the first sensor comprises ones at least one of an illumination sensor, a fingerprint sensor, and a proximity detection sensor, and the second sensor comprises an image sensor.

3. The display panel of claim 1, wherein the second transmissive region is configured to be disposed within the first transmissive region.

4. The display panel of claim 1, wherein the first transmissive region includes a first-1 transmissive region and a first-2 transmissive region, the second transmissive region is configured to be laterally juxtaposed between the first-1 transmissive region and the first-2 transmissive region.

5. The display panel of claim 1, wherein the second transmissive region associated with the light emitting layer includes a plurality of light transmissive regions, and wherein a cathode is absent from regions corresponding to the plurality of light transmissive regions.

6. The display panel of claim 1, further comprising:
a touch layer configured to detect touch input, the touch layer being configured to have a first region having a first electrode pattern and a second region having a second electrode pattern that is different from the first electrode pattern.

7. The display panel of claim 6, wherein the second region overlaps the first transmissive region and the second transmissive region.

8. The display panel of claim 6, wherein the second region overlaps the first transmissive region, the second transmissive region, and the display region.

9. A display panel, comprising:
   a light emitting layer configured to output images; and
   a touch layer configured to detect touch input on the light emitting layer;
   wherein the touch layer includes a first region having a plurality of first electrodes and a second region having a plurality of second electrodes, wherein a size of the first electrode is larger than a size of the second electrode.

10. The display panel of claim 9, wherein the second region is disposed to cover a portion of the light emitting layer that has an increased transmissivity.

11. The display panel of claim 10, wherein the first region of the touch layer is disposed at a first end of the display panel, and the second region of the touch layer is disposed at a second end of the display panel that opposes the first end.

12. The display panel of claim 10, wherein the second region of the touch layer is disposed within and at least partially surrounded by the first region of the touch layer.

13. The display panel of claim 10, wherein the portion of the light emitting layer comprises a first transmissive region having a first pixel density that is less than a median pixel density of the light emitting layer.

14. The display panel of claim 13, wherein at least one sensor is configured to be disposed below the first transmissive region.

15. The display panel of claim 13, wherein the portion of the light emitting layer comprises a second transmissive region having a second pixel density that is less than the first pixel density.

16. The display panel of claim 15, wherein at least one first sensor is disposed below the first transmissive region and at least one second sensor is disposed below the second transmissive region.

* * * * *